(12) United States Patent
Tripathi

(10) Patent No.: US 10,277,205 B1
(45) Date of Patent: Apr. 30, 2019

(54) SPDT SWITCH WITH HIGH LINEARITY

(71) Applicant: Samsung Electronics Co., Ltd., Suwon-si, Gyeonggi-do (KR)

(72) Inventor: Vaibhav Tripathi, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/111,139

(22) Filed: Aug. 23, 2018

Related U.S. Application Data

(60) Provisional application No. 62/681,040, filed on Jun. 5, 2018.

(51) Int. Cl.
| | |
|---|---|
| H03K 17/687 | (2006.01) |
| H03K 3/356 | (2006.01) |
| H03K 3/01 | (2006.01) |
| H03F 3/19 | (2006.01) |
| H03F 3/24 | (2006.01) |

(52) U.S. Cl.
CPC ............... H03K 3/01 (2013.01); H03F 3/19 (2013.01); H03F 3/245 (2013.01); H03K 17/687 (2013.01); *H03F 2200/294* (2013.01); *H03F 2200/451* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,883,541 | A | * | 3/1999 | Tahara ............... H03K 17/693 327/434 |
| 6,066,974 | A | * | 5/2000 | Lin ..................... H03K 17/693 327/320 |
| 7,098,755 | B2 | | 8/2006 | Zhao et al. |
| 7,123,898 | B2 | | 10/2006 | Burgener et al. |
| 7,199,635 | B2 | | 4/2007 | Nakatsuka et al. |
| 8,207,781 | B2 | | 6/2012 | Noh et al. |

OTHER PUBLICATIONS

Fu, Chang-Tsung. et al., "A 5-Ghz, 30-dBm, 0.9-dB Insertion Loss Single-Pole Double-Throw T/R Switch in 90nm CMOS", IEEE RFICS, Apr. 17, 2008, pp. 317-320.
Cardoso, Adilson, S., et al, "Evaluating the Effects of Single Event Transients in FET-Based Single-Pole Double-Throw RF Switches", IEEE Transactions on Nuclear Science, Apr. 31, 2014, pp. 756-765, vol. 61, No. 2.

* cited by examiner

*Primary Examiner* — An T Luu
(74) *Attorney, Agent, or Firm* — Lewis Roca Rothgerber Christie LLP

(57) ABSTRACT

A single-pole double-throw switch. In some embodiments, the switch includes a first switching transistor connected between a common terminal of the single-pole double-throw switch and a first switched terminal of the single-pole double-throw switch, a second switching transistor connected between the common terminal of the single-pole double-throw switch and a second switched terminal of the single-pole double-throw switch, a first auxiliary transistor connected between the common terminal of the single-pole double-throw switch and a gate of the first switching transistor, and a second auxiliary transistor connected between the common terminal of the single-pole double-throw switch and a gate of the second switching transistor.

18 Claims, 4 Drawing Sheets

SPDT SWITCH WITH HIGH LINEARITY

CROSS-REFERENCE TO RELATED APPLICATION(S)

The present application claims priority to and the benefit of U.S. Provisional Application No. 62/681,040, filed Jun. 5, 2018, entitled "SYSTEM AND METHOD FOR PROVIDING HIGHLY-LINEAR SINGLE-POLE DOUBLE THROW (SPDT) SWITCH", the entire content of which is incorporated herein by reference.

FIELD

One or more aspects of embodiments according to the present disclosure relate to switches, and more particularly to an SPDT switch with high linearity.

BACKGROUND

Switches (e.g., single-pole, double-throw (SPDT) switches) used for routing radio frequency and millimeter-wave signals may be fabricated using transistors and used in various applications, including, for example, transmit-receive switching for a transceiver. The performance of such switches may be limited in some designs, however, because of a loss of linearity that may result from insufficient bootstrapping, or because of return loss degradation that may result from the presence of parasitic capacitance associated with on-chip coupling capacitors.

Thus, there is a need for an improved design for an SPDT switch.

SUMMARY

According to an embodiment of the present disclosure, there is provided a single-pole double-throw switch, including: a first switching transistor connected between a common terminal of the single-pole double-throw switch and a first switched terminal of the single-pole double-throw switch, a second switching transistor connected between the common terminal of the single-pole double-throw switch and a second switched terminal of the single-pole double-throw switch, a first auxiliary transistor connected between the common terminal of the single-pole double-throw switch and a gate of the first switching transistor, and a second auxiliary transistor connected between the common terminal of the single-pole double-throw switch and a gate of the second switching transistor.

In some embodiments, the gate of the first auxiliary transistor is connected to the gate of the second switching transistor.

In some embodiments, the gate of the second auxiliary transistor is connected to the gate of the first switching transistor.

In some embodiments, the single-pole double-throw switch further includes a first coupling capacitor connected between the first switched terminal of the single-pole double-throw switch and the first switching transistor.

In some embodiments, the single-pole double-throw switch further includes a second coupling capacitor connected between the second switched terminal of the single-pole double-throw switch and the second switching transistor.

In some embodiments: a channel width of the first auxiliary transistor is at most as great as a channel width of the first switching transistor, and a channel width of the second auxiliary transistor is at most as great as a channel width of the second switching transistor.

In some embodiments: the channel width of the first auxiliary transistor is at most 50% of the channel width of the first switching transistor, and the channel width of the second auxiliary transistor is at most 50% of the channel width of the second switching transistor.

In some embodiments: the channel width of the first auxiliary transistor is at most 35% of the channel width of the first switching transistor, and the channel width of the second auxiliary transistor is at most 35% of the channel width of the second switching transistor.

In some embodiments: the first switching transistor is connected directly to the common terminal without an intervening coupling capacitor, and the second switching transistor is connected directly to the common terminal without an intervening coupling capacitor.

According to an embodiment of the present disclosure, there is provided a transmit-receive circuit including: a single-pole double-throw switch having a common terminal, a first switched terminal, and a second switched terminal; a low-noise amplifier having an input connected to the first switched terminal, and a power amplifier having an output connected to the second switched terminal, the single-pole double-throw switch including: a first switching transistor connected between the common terminal of the single-pole double-throw switch and the first switched terminal of the single-pole double-throw switch, a second switching transistor connected between the common terminal of the single-pole double-throw switch and the second switched terminal of the single-pole double-throw switch, a first auxiliary transistor connected between the common terminal of the single-pole double-throw switch and a gate of the first switching transistor, and a second auxiliary transistor connected between the common terminal of the single-pole double-throw switch and a gate of the second switching transistor.

In some embodiments, the gate of the first auxiliary transistor is connected to the gate of the second switching transistor.

In some embodiments, the gate of the second auxiliary transistor is connected to the gate of the first switching transistor.

In some embodiments, the transmit-receive circuit further includes a first coupling capacitor connected between the first switched terminal of the single-pole double-throw switch and the first switching transistor.

In some embodiments, the transmit-receive circuit further includes a second coupling capacitor connected between the second switched terminal of the single-pole double-throw switch and the second switching transistor.

In some embodiments: a channel width of the first auxiliary transistor is at most as great as a channel width of the first switching transistor, and a channel width of the second auxiliary transistor is at most as great as a channel width of the second switching transistor.

In some embodiments: the channel width of the first auxiliary transistor is at most 50% of the channel width of the first switching transistor, and the channel width of the second auxiliary transistor is at most 50% of the channel width of the second switching transistor.

In some embodiments: the channel width of the first auxiliary transistor is at most 35% of the channel width of the first switching transistor, and the channel width of the second auxiliary transistor is at most 35% of the channel width of the second switching transistor. In some embodiments: the first switching transistor is connected directly to the common terminal without an intervening coupling capacitor, and the second switching transistor is connected directly to the common terminal without an intervening coupling capacitor.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of an SPDT switch with high linearity provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
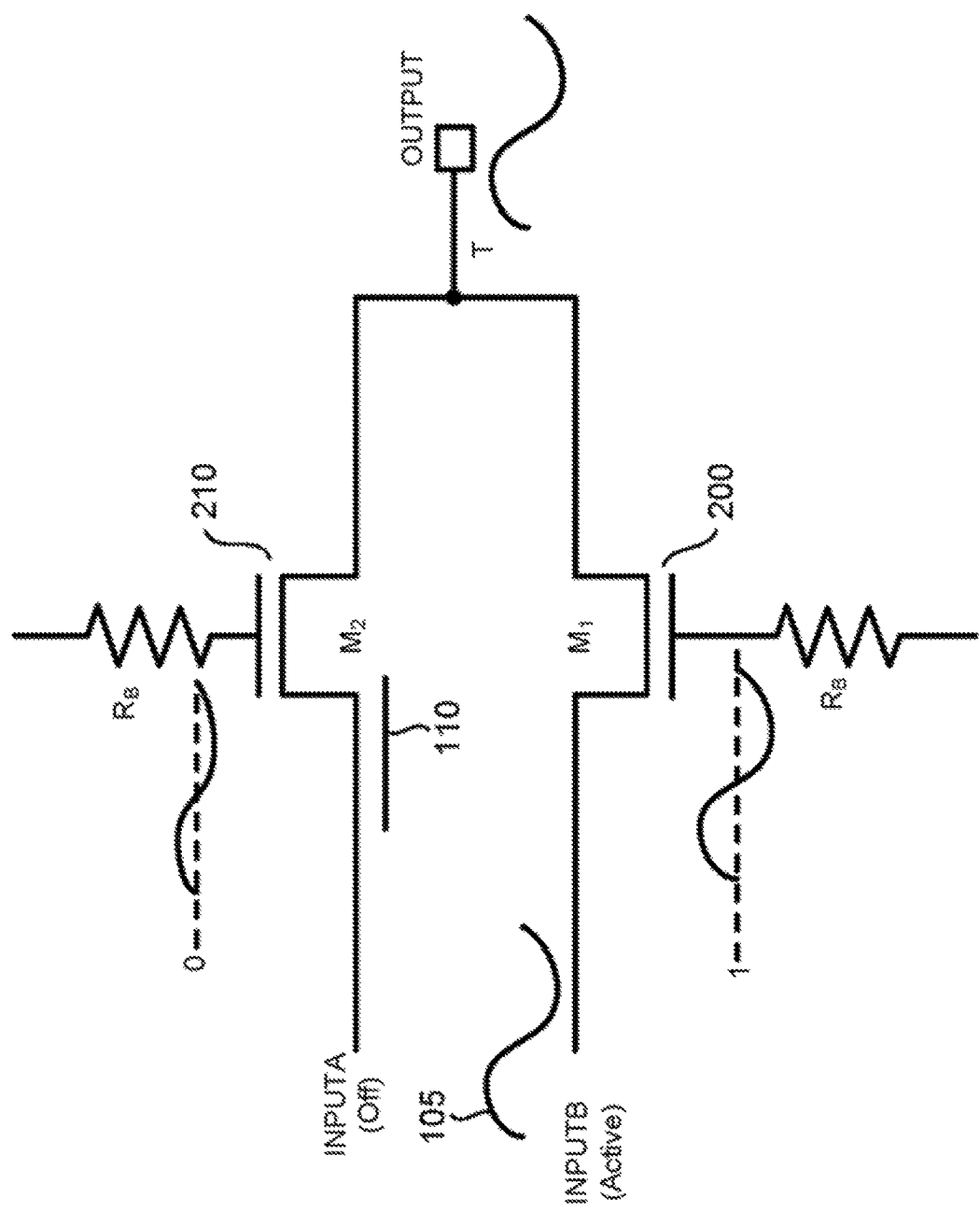
FIG. 1A is a schematic diagram of an SPDT switch.

Referring to FIG. 1A, in some related art SPDT switch circuits, insufficient bootstrapping may compromise the linearity of the circuit. For example, when the first switching transistor 200 of the switch is turned on and the second switching transistor 210 of the switch is turned off, an input signal 105 present at the first switched terminal (Input B) may be present at the common node T (as a result of the first switching transistor 200 of the switch being turned on), and the same signal may also be present on the gate of the first switching transistor 200, as a result of capacitive coupling between the main terminals (the source and the drain) of the first switching transistor 200 and the gate of the first switching transistor 200 (through internal capacitance in the first switching transistor 200, i.e., through the gate-source capacitance of the first switching transistor 200, and through the gate-drain capacitance of the first switching transistor 200). As a result, the voltage between the gate and the main terminals is constant (i.e., it does not fluctuate with the signal) and equal to the DC bias voltage across these terminals. For example, if the gate bias is 1 V as shown, and the bias voltages of the main terminals are each 0 V as shown, then the gate is at a voltage that is 1 V greater than either main terminal (i.e., Vgs=Vgd=1 V). This behavior, of the gate voltage following the voltages of the main terminals of the transistor, as a result of capacitive coupling, so that the AC voltages on all three terminals are the same, may be referred to as "bootstrapping". It will be understood that in the circuit of FIG. 1A, neither transistor has a fixed source and a fixed drain; instead, one or the other of the main terminals may act as the drain at any point in time (and the other may act as the source) depending on the direction of the voltage across the main terminals.

Figure 1B:
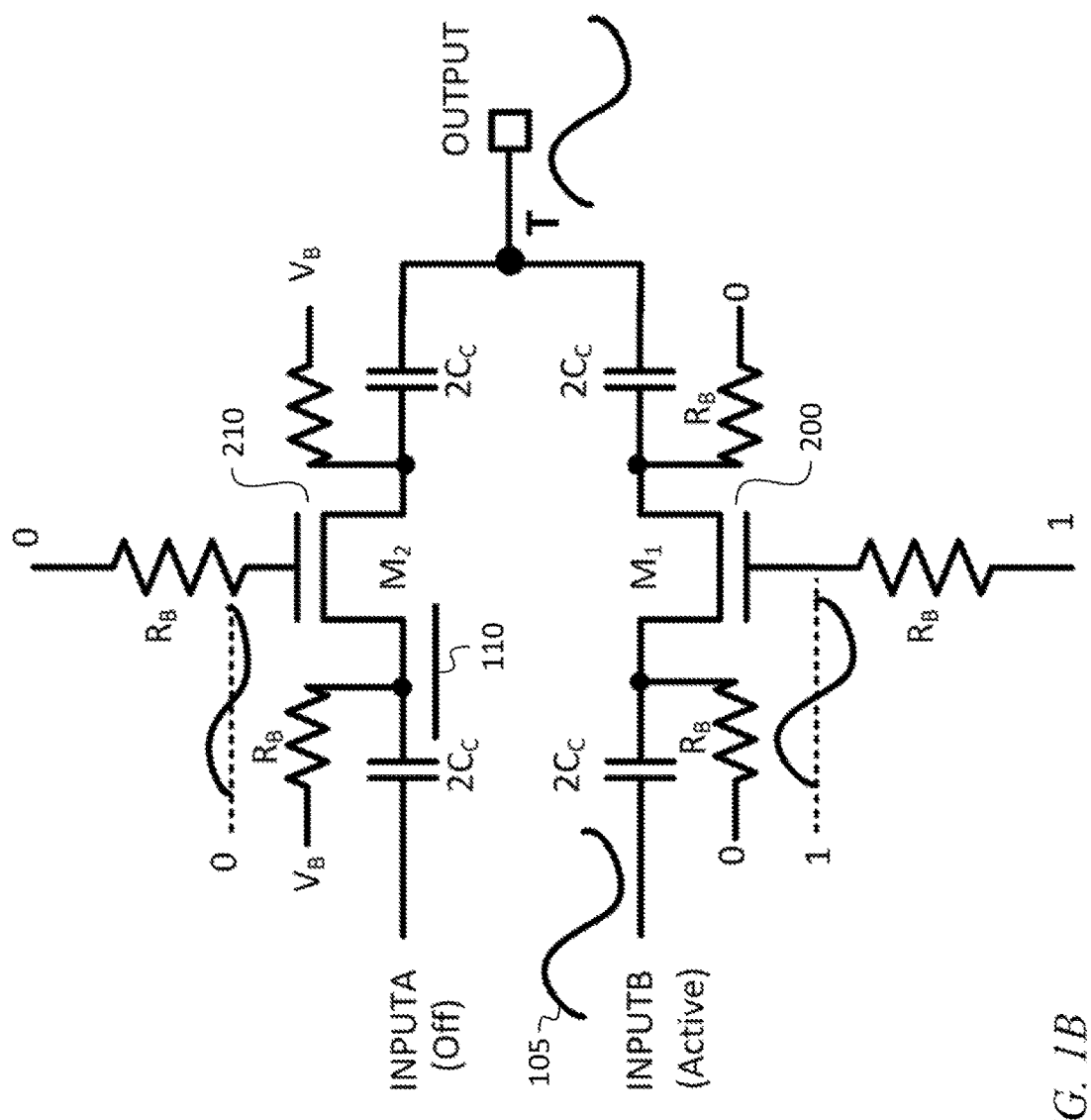
FIG. 1B is a schematic diagram of an SPDT switch.

In the circuit of FIG. 1A, bootstrapping may fail to accomplish the same effect with respect to the second switching transistor 210, which is turned off, because the signal 110 at the second switched terminal (Input A) may differ from the signal at the common node T (as illustrated, the signal 110 at the second switched terminal is zero, and the signal at the common node T is equal to the signal 105 at the first switched terminal). Because of this difference, the AC signal on the gate of the second switching transistor 210 may be a combination (e.g., a weighted average) of the signals at the two main terminals of the second switching transistor 210 (both of which are coupled to the gate by capacitive coupling), and (unlike the case for the first switching transistor 200) the AC components of the voltages between the gate and the main terminals may therefore not vanish. The non-vanishing voltages between the gate and the main terminals may cause the conductivity of the channel of the second switching transistor 210 to be modulated by the AC signal, resulting in reduced linearity. Referring to FIG. 1B, in some embodiments, coupling capacitors may be used to make possible the application of bias voltages to the main terminals of both the first switching transistor 200 and the second switching transistor 210. In such an embodiment, the linearity of the switch may be improved; the presence of the coupling capacitors and their associated parasitic capacitances, however, may result in degradation of both input return loss ($S_{11}$) and output return loss ($S_{22}$).

Figure 2:
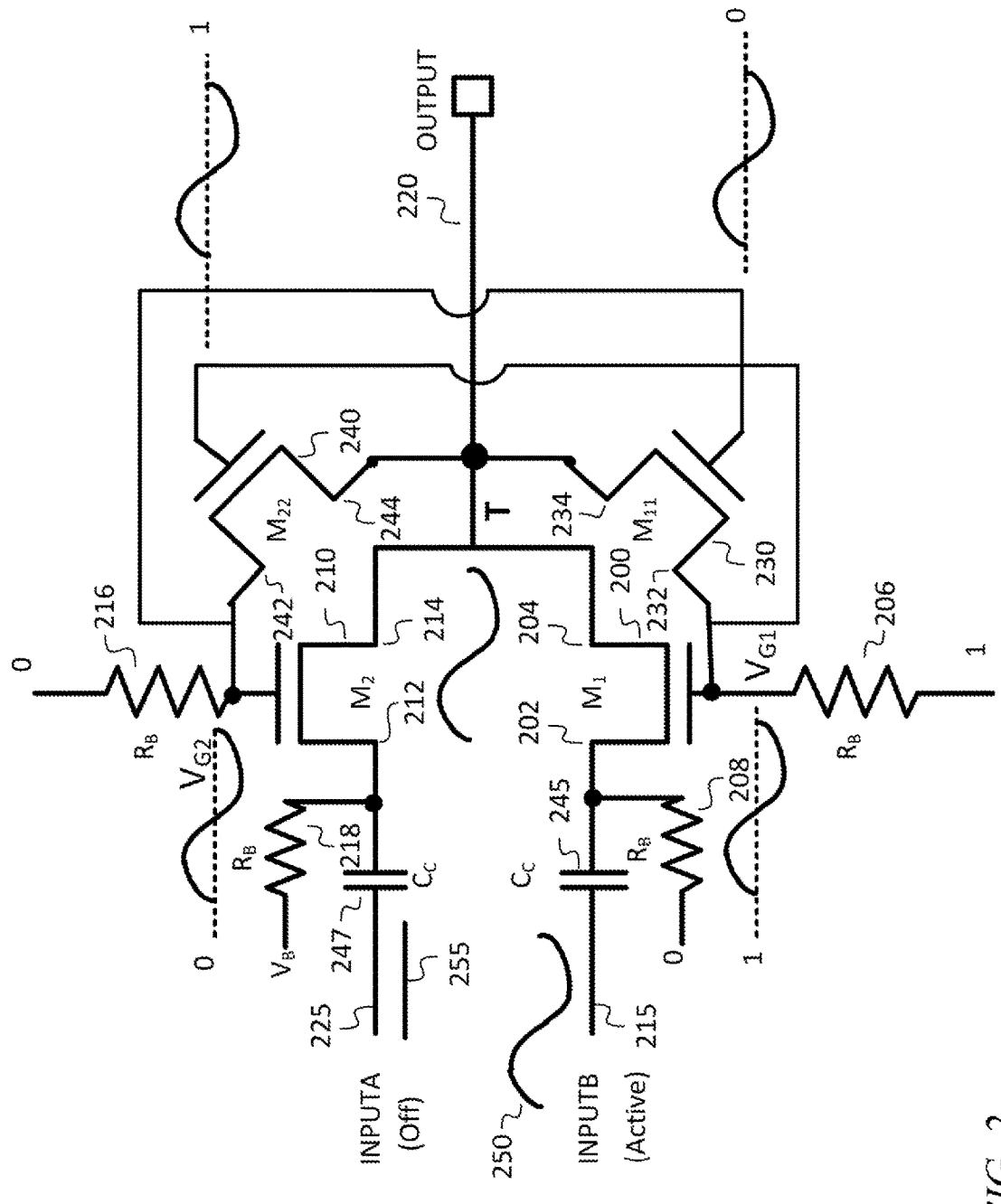
FIG. 2 is a schematic diagram of an SPDT switch, according to an embodiment of the present disclosure.
Figure 3:
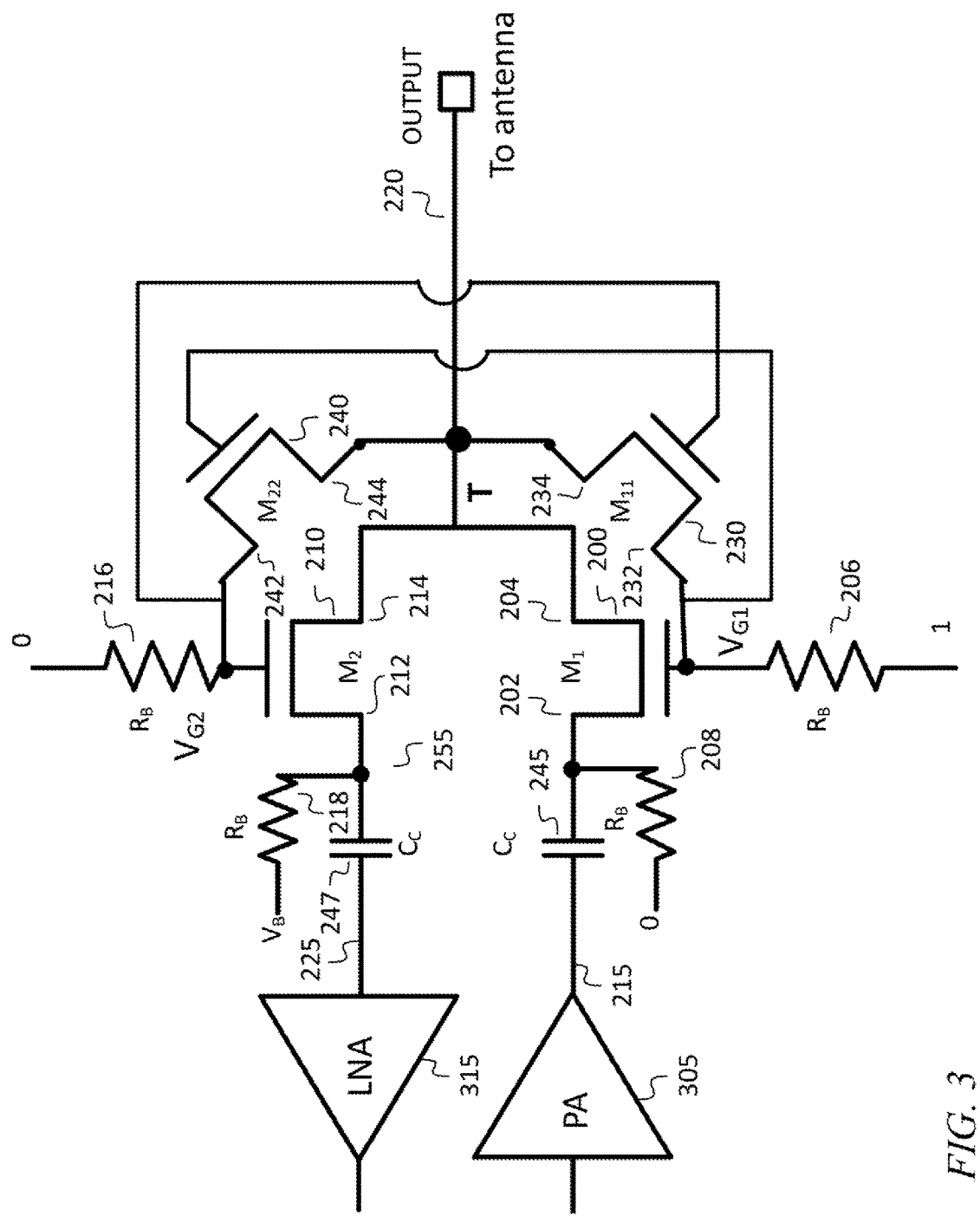
FIG. 3 is a schematic diagram of an SPDT switch, according to an embodiment of the present disclosure.

Referring to FIG. 2, in some embodiments, a circuit for an SPDT switch includes (like the circuits of FIGS. 1A and 1B) a first switching transistor 200 and a second switching transistor 210. The first switching transistor 200 and the second switching transistor 210 route signals in the SPDT switch, so that, for example, if the first switching transistor 200 is turned on, and the second switching transistor 210 is turned off, the first switched terminal 215 is electrically connected (or just "connected" for brevity) to the common terminal 220 and the common terminal 220 is not connected to the second switched terminal 225. The circuit further includes a first auxiliary transistor 230 connected between the gate of the first switching transistor 200 and the common terminal 220, a second auxiliary transistor 240 connected between the gate of the second switching transistor 210 and the common terminal 220, a first coupling capacitor 245, and a second coupling capacitor 247. The gate of the first auxiliary transistor 230 is connected to the gate of the second switching transistor 210, and the gate of the second auxiliary transistor 240 is connected to the gate of the first switching transistor 200, as shown.

The bias voltages of the SPDT switch may each be selected from one of two voltages that may be referred to, respectively, as a "low" voltage (e.g., 0 V, as shown) and a "high" voltage (e.g., 1 V, as shown). These bias voltages may be supplied by a control circuit connected to four bias resistors 206, 208, 216, 218, as discussed in further detail below. The respective values of the high and low voltages may be selected to be any two voltage values for which the high voltage is sufficiently greater than the low voltage that (i) when the gate of a transistor of the SPDT switch is at the high voltage and the two main terminals of the transistor are at the low voltage, the transistor is turned on, and (ii) when the gate of a transistor of the SPDT switch is at the low voltage and the two main terminals of the transistor are at the high voltage, the transistor is turned off. Moreover, coupling capacitors at the common terminal 220 (which are present in the embodiment of FIG. 1B) are not needed in the embodiment of FIG. 2, because in the embodiment of FIG. 2 there is no need to maintain different bias voltages at the second main terminals 204, 214, of the first and second switching transistors 200, 210.

In a first state of the SPDT switch, in which the first switching transistor 200 is turned on and the second switching transistor 210 is turned off (and which is illustrated in FIG. 2), the DC voltage at the gate of the first switching transistor 200 is high (as a result of a high bias applied to a first gate bias resistor 206 by the control circuit), the DC voltage at the first main terminal 202 of the first switching transistor 200 is low (as a result of a low bias applied to a first terminal bias resistor 208 by the control circuit), and the DC voltage at the second main terminal 204 of the first switching transistor 200 is low (as a result of the first switching transistor 200 being turned on). Signals for the first state of the SPDT switch are shown in FIG. 2. A first signal 250 (having a nonzero AC component) is present at the first switched terminal 215, and a second signal 255 (having no AC component) is present at the second switched terminal 225.

As a result of the first switching transistor 200 being turned on, the AC signal 250 present at the first switched terminal 215 is transmitted (through the first switching transistor 200) to the common terminal 220. The DC voltage at the gate of the second switching transistor 210 is low (as a result of a low bias applied to a second gate bias resistor 216 by the control circuit). The DC voltage at the gate of the second auxiliary transistor 240 is high, as a result of the high bias applied to the first gate bias resistor 206 by the control circuit. The DC voltage at both of the main terminals of the second auxiliary transistor 240 is low, the DC voltage at a first main terminal 242 of the second auxiliary transistor 240 being low as a result of the low bias applied to the second gate bias resistor 216 by the control circuit, and the DC voltage at a second main terminal 244 of the second auxiliary transistor 240 being low as a result of the common terminal 220 being at the low DC voltage. The second auxiliary transistor 240 is therefore turned on, and it causes the AC signal at the common terminal 220 (which is substantially equal to the AC signal 250 present at the first switched terminal 215) to appear at the gate of the second switching transistor 210. In the first state, the first auxiliary transistor 230 is turned off.

It may be seen from the foregoing that in the first state, the second auxiliary transistor 240 remedies the problem of insufficient bootstrapping described above in the context of FIG. 1A, and that in the embodiment of FIG. 2, in the first state, the AC signal 250 is present, substantially unattenuated, at the gate of the second switching transistor 210. As a result, the operating point of the second switching transistor 210 is consistent, substantially irrespective of the RF signal swing, and high linearity may result.

In the second state, in which the second switched terminal 225 is connected to the common terminal 220 and the first switched terminal 215 is not connected to the common terminal 220, the bias voltages applied by the control circuit are reversed (a high bias is applied to the first terminal bias resistor 208 and to the second gate bias resistor 216, and a low bias is applied to the second terminal bias resistor 218 and to the first gate bias resistor 206). In the second state, the first switching transistor 200 and the second auxiliary transistor 240 are turned off, and the second switching transistor 210 and the first auxiliary transistor 230 are turned on. In the second state, the first auxiliary transistor 230 performs the function performed in the first state by the second auxiliary transistor 240, i.e., it connects the common terminal 220 and the gate of the first switching transistor 200, so that the AC signal is the same at the two nodes; as such, it remedies the problem of insufficient bootstrapping that would, in some embodiments, cause degraded linearity in the absence of the first auxiliary transistor 230.

In some embodiments an SPDT switch is used as a transmit-receive select switch in a radio frequency or millimeter-wave transceiver. The first switched terminal 215 may be fed by a power amplifier 305, and the second switched terminal 225 may feed a low noise amplifier 315. The common terminal 220 may be connected to an antenna (e.g., through an antenna matching network). In operation, when the transceiver is transmitting, the SPDT switch may be in the first state, allowing a signal from the power amplifier 305 to propagate to the antenna, and when the transceiver is receiving, the SPDT switch may be in the second state, allowing a signal from the antenna to propagate to the low noise amplifier 315. By disconnecting the respective unused signal path in each of the first (transmitting) state and the second (receiving) state, the SPDT switch may help to reduce or eliminate various problems (e.g., instability of the power amplifier 305, noise from the power amplifier 305 degrading the signal received by the low noise amplifier 315, and increased insertion loss and reduced return loss for the signals travelling in both directions) that might occur were both amplifiers connected directly to the antenna matching network without the intervening SPDT switch.

In some embodiments, an SPDT switch according to the circuit of FIG. 2 may exhibit superior performance to an otherwise similar circuit constructed according to FIG. 1A (e.g., using identical switching transistors and identical (albeit more) coupling capacitors, and lacking the auxiliary transistors of the circuit of FIG. 2). For example, an SPDT switch constructed according to the circuit of FIG. 2 may exhibit a 3 dB (or more, e.g., 10 dB) higher (e.g., a 3 dBm higher) 1-dB-compression point (i.e., better linearity) than an otherwise similar circuit constructed according to FIG. 1A. Moreover, an SPDT switch constructed according to the circuit of FIG. 2 may exhibit better robustness to modelling limitations, and to process, voltage, and temperature variations, than an otherwise similar circuit constructed according to FIG. 1A.

The transistors of the SPDT switch may be field effect transistors as shown, e.g., metal oxide semiconductor field effect transistors (MOSFETs). N-channel MOSFETs may be used, both because N-channel MOSFETs may have higher majority carrier mobility than P-channel MOSFETs, and because, if the SPDT switch is connected to a ground-referenced source or load (e.g., a ground-referenced antenna), the signals transmitted by the SPDT switch may be near ground, and N-channel MOSFETs may be better able to transfer such signals than P-channel MOSFETs. The first auxiliary transistor 230 may be smaller than the first switching transistor 200 (e.g., the first auxiliary transistor 230 may have a channel width that is between 30% and 50% of the channel width of the first switching transistor 200), or that is at most equal to the channel width of the first switching transistor 200 (e.g., the first auxiliary transistor 230 may have a channel width that is between 30% and 100% of the channel width of the first switching transistor 200). Similarly, the second auxiliary transistor 240 may have a channel width that is between 30% and 100% of the channel width of the second switching transistor 210.

As used herein, the two principal terminals of a transistor (e.g., the source and the drain, for a MOSFET, or the collector and the emitter, for a bipolar transistor) may be referred to as the "main" terminals of the transistor, and the terminal used to control the transistor (e.g., the gate, for a MOSFET, or the base, for a bipolar transistor) may be referred to as the "control" terminal of the transistor. As used herein, when the connections to a transistor are described with terminology used for two-terminal devices, it is the connections to the main terminals of the transistor that are described. For example, a transistor that is "connected between" two nodes of a circuit has a first one of the main terminals of the transistor connected to a first one of the two nodes and a second one of the main terminals of the transistor connected to a second one of the two nodes. As another example, when two transistors are said to be connected "in series" (as in the case of a CMOS inverter), a main terminal of one of the two transistors is connected to a main terminal of the other of the two transistors.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of an SPDT switch with high linearity have been specifically described and illustrated herein, many modifications and variations will be apparent to those skilled in the art. Accordingly, it is to be understood that an SPDT switch with high linearity constructed according to principles of this disclosure may be embodied other than as specifically described herein. The invention is also defined in the following claims, and equivalents thereof.

What is claimed is:

1. A single-pole double-throw switch, comprising:
   a first switching transistor connected between a common terminal of the single-pole double-throw switch and a first switched terminal of the single-pole double-throw switch,
   a second switching transistor connected between the common terminal of the single-pole double-throw switch and a second switched terminal of the single-pole double-throw switch,
   a first auxiliary transistor connected between the common terminal of the single-pole double-throw switch and a gate of the first switching transistor, and
   a second auxiliary transistor connected between the common terminal of the single-pole double-throw switch and a gate of the second switching transistor.

2. The single-pole double-throw switch of claim 1, wherein the gate of the first auxiliary transistor is connected to the gate of the second switching transistor.

3. The single-pole double-throw switch of claim 2, wherein the gate of the second auxiliary transistor is connected to the gate of the first switching transistor.

4. The single-pole double-throw switch of claim 1, further comprising a first coupling capacitor connected between the first switched terminal of the single-pole double-throw switch and the first switching transistor.

5. The single-pole double-throw switch of claim 4, further comprising a second coupling capacitor connected between the second switched terminal of the single-pole double-throw switch and the second switching transistor.

6. The single-pole double-throw switch of claim 1, wherein:
   a channel width of the first auxiliary transistor is at most as great as a channel width of the first switching transistor, and
   a channel width of the second auxiliary transistor is at most as great as a channel width of the second switching transistor.

7. The single-pole double-throw switch of claim 6, wherein:
   the channel width of the first auxiliary transistor is at most 50% of the channel width of the first switching transistor, and
   the channel width of the second auxiliary transistor is at most 50% of the channel width of the second switching transistor.

8. The single-pole double-throw switch of claim 6, wherein:
   the channel width of the first auxiliary transistor is at most 35% of the channel width of the first switching transistor, and
   the channel width of the second auxiliary transistor is at most 35% of the channel width of the second switching transistor.

9. The single-pole double-throw switch of claim 1, wherein:
   the first switching transistor is connected directly to the common terminal without an intervening coupling capacitor, and
   the second switching transistor is connected directly to the common terminal without an intervening coupling capacitor.

10. A transmit-receive circuit comprising:
    a single-pole double-throw switch having a common terminal, a first switched terminal, and a second switched terminal;
    a low-noise amplifier having an input connected to the first switched terminal, and
    a power amplifier having an output connected to the second switched terminal,
    the single-pole double-throw switch comprising:
      a first switching transistor connected between the common terminal of the single-pole double-throw switch and the first switched terminal of the single-pole double-throw switch,
      a second switching transistor connected between the common terminal of the single-pole double-throw switch and the second switched terminal of the single-pole double-throw switch,
      a first auxiliary transistor connected between the common terminal of the single-pole double-throw switch and a gate of the first switching transistor, and
      a second auxiliary transistor connected between the common terminal of the single-pole double-throw switch and a gate of the second switching transistor.

11. The single-pole double-throw switch of claim 10, wherein the gate of the first auxiliary transistor is connected to the gate of the second switching transistor.

12. The single-pole double-throw switch of claim 11, wherein the gate of the second auxiliary transistor is connected to the gate of the first switching transistor.

13. The single-pole double-throw switch of claim 10, further comprising a first coupling capacitor connected between the first switched terminal of the single-pole double-throw switch and the first switching transistor.

14. The single-pole double-throw switch of claim 13, further comprising a second coupling capacitor connected between the second switched terminal of the single-pole double-throw switch and the second switching transistor.

15. The single-pole double-throw switch of claim 10, wherein:
    a channel width of the first auxiliary transistor is at most as great as a channel width of the first switching transistor, and
    a channel width of the second auxiliary transistor is at most as great as a channel width of the second switching transistor.

16. The single-pole double-throw switch of claim 15, wherein:
    the channel width of the first auxiliary transistor is at most 50% of the channel width of the first switching transistor, and
    the channel width of the second auxiliary transistor is at most 50% of the channel width of the second switching transistor.

17. The single-pole double-throw switch of claim 16, wherein:
    the channel width of the first auxiliary transistor is at most 35% of the channel width of the first switching transistor, and
    the channel width of the second auxiliary transistor is at most 35% of the channel width of the second switching transistor.

18. The single-pole double-throw switch of claim 10, wherein:
    the first switching transistor is connected directly to the common terminal without an intervening coupling capacitor, and
    the second switching transistor is connected directly to the common terminal without an intervening coupling capacitor.

* * * * *

UNITED STATES PATENT AND TRADEMARK OFFICE
CERTIFICATE OF CORRECTION

PATENT NO. : 10,277,205 B1
APPLICATION NO. : 16/111139
DATED : April 30, 2019
INVENTOR(S) : Vaibhav Tripathi It is certified that error appears in the above-identified patent and that said Letters Patent is hereby corrected as shown below:

In the Claims

Column 10, Line 4, Claim 11, Delete "single-pole double-throw switch", Insert -- transmit-receive circuit --

Column 10, Line 7, Claim 12, Delete "single-pole double-throw switch", Insert -- transmit-receive circuit --

Column 10, Line 10, Claim 13, Delete "single-pole double-throw switch", Insert -- transmit-receive circuit --

Column 10, Line 14, Claim 14, Delete "single-pole double-throw switch", Insert -- transmit-receive circuit --

Column 10, Line 18, Claim 15, Delete "single-pole double-throw switch", Insert -- transmit-receive circuit --

Column 10, Line 26, Claim 16, Delete "single-pole double-throw switch", Insert -- transmit-receive circuit --

Column 10, Line 34, Claim 17, Delete "single-pole double-throw switch", Insert -- transmit-receive circuit --

Column 10, Line 42, Claim 18, Delete "single-pole double-throw switch", Insert -- transmit-receive circuit --

Signed and Sealed this
Eleventh Day of January, 2022

Drew Hirshfeld
*Performing the Functions and Duties of the
Under Secretary of Commerce for Intellectual Property and
Director of the United States Patent and Trademark Office*